United States Patent [19]

Sansone

[11] 4,215,325
[45] Jul. 29, 1980

[54] MINIMAL DISTORTION VIDEO BANDPASS FILTER

[75] Inventor: Francis N. Sansone, Kensington, Md.

[73] Assignee: The United States of America as represented by the Secretary of the Navy, Washington, D.C.

[21] Appl. No.: 19,039

[22] Filed: Mar. 9, 1979

[51] Int. Cl.² ............... H03H 7/08; H03H 7/14; H03H 7/04
[52] U.S. Cl. ..................... 333/20; 333/167; 333/176
[58] Field of Search ............... 333/167–172, 333/20, 174–176; 343/5 VQ, 5 DP; 358/36–38, 166–167, 904

[56] References Cited

U.S. PATENT DOCUMENTS

| | | | |
|---|---|---|---|
| 1,766,040 | 6/1930 | Kolster | 333/175 |
| 2,247,538 | 7/1941 | Wheeler | 333/174 X |
| 2,247,898 | 7/1941 | Wheeler | 333/175 |
| 2,627,546 | 2/1953 | Paine | 333/20 X |
| 2,943,281 | 6/1960 | Boyer | 333/170 |
| 2,963,647 | 12/1960 | Dean | 333/20 X |
| 3,135,933 | 6/1964 | Johnson | 333/141 X |
| 3,614,674 | 10/1971 | Hill | 333/20 |

OTHER PUBLICATIONS

Applebaum–"Low Pass Filters–The Easy Way" (Part 1) EDN Magazine, Mar. 1967 (Reprint); L63; 2 pp.
Applebaum–"Low Pass Filters–The Easy Way" (Part 2) EDN Magazine, Apr. 1967 (Reprint); L66; 2 pp.

*Primary Examiner*—Marvin L. Nussbaum
*Attorney, Agent, or Firm*—R. S. Sciascia; A. L. Branning

[57] ABSTRACT

The present video bandpass filter passes a sinusoidal video output in response to a square pulse input. The video band-pass filter rejects d.c. and low frequency signal components as well as noise and spurious signals generated at the transmitting source. The video bandpass filter is comprised of an M-derived filter, a series-tuned notch filter, and a final d.c. blocking series-tuned filter which, together, pass the desired video with minimal distortion.

4 Claims, 2 Drawing Figures

MINIMAL DISTORTION VIDEO BANDPASS FILTER

SUMMARY OF THE INVENTION

The present invention improves prior art filters by combining a pulse shaping element with an M-derived filter, a notch filter provided with damping at the cut-off frequency, and a d.c. blocking circuit to form a video bandpass filter which transforms a pulse input into a smooth sinusoidal output minimally affected by noise, distortion, and other spurious signals and harmonics.

The invention significantly reduces ringing in the circuit and provides damping which prevents overnotching at the cut-off frequency. In accordance with the present circuit, signal response at cut-off (e.g., 20 MHz) is attenuated, but enough signal is permitted to pass to preserve the response characteristics at the desired frequency (e.g., 10 MHz).

DESCRIPTION OF THE INVENTION

Figure 1:
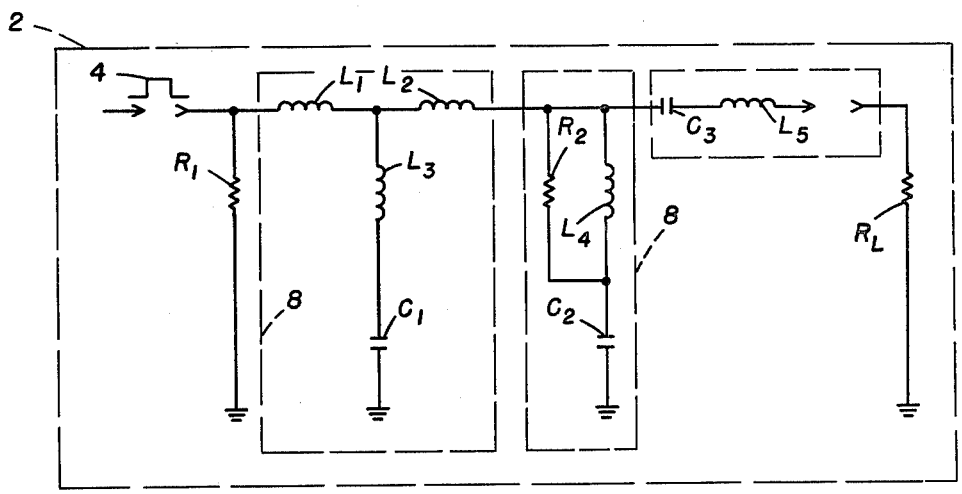
FIG. 1 illustrates the circuitry of the invention.

Referring to FIG. 1, a four-stage video bandpass filter 2 is shown. Input 4 to the filter 2 is rounded off, or smoothed, in a first stage comprised of a resistance $R_1$, connected to ground. From the first stage, the signal enters an M-derived filter stage 6 comprised of two identical, in-series inductances $L_1$ and $L_2$ having a grounded LC series circuit, comprised of inductance $L_3$ and capacitor $C_1$, between inductances $L_1$ and $L_2$. The output of $L_2$, which corresponds to the output of the M-derived filter stage 6, enters a series tuned notch filter stage 8. The notch filter stage 8 includes an RLC circuit to ground wherein a resistance $R_2$ is in parallel to an inductance $L_4$, both being in series with a capacitor $C_2$. To block out d.c. portions and prevent them from affecting the sine wave output, a final stage comprising a capacitor $C_3$ in series with an inductance $L_5$ which feeds an output load $R_L$ is provided.

Figure 2:
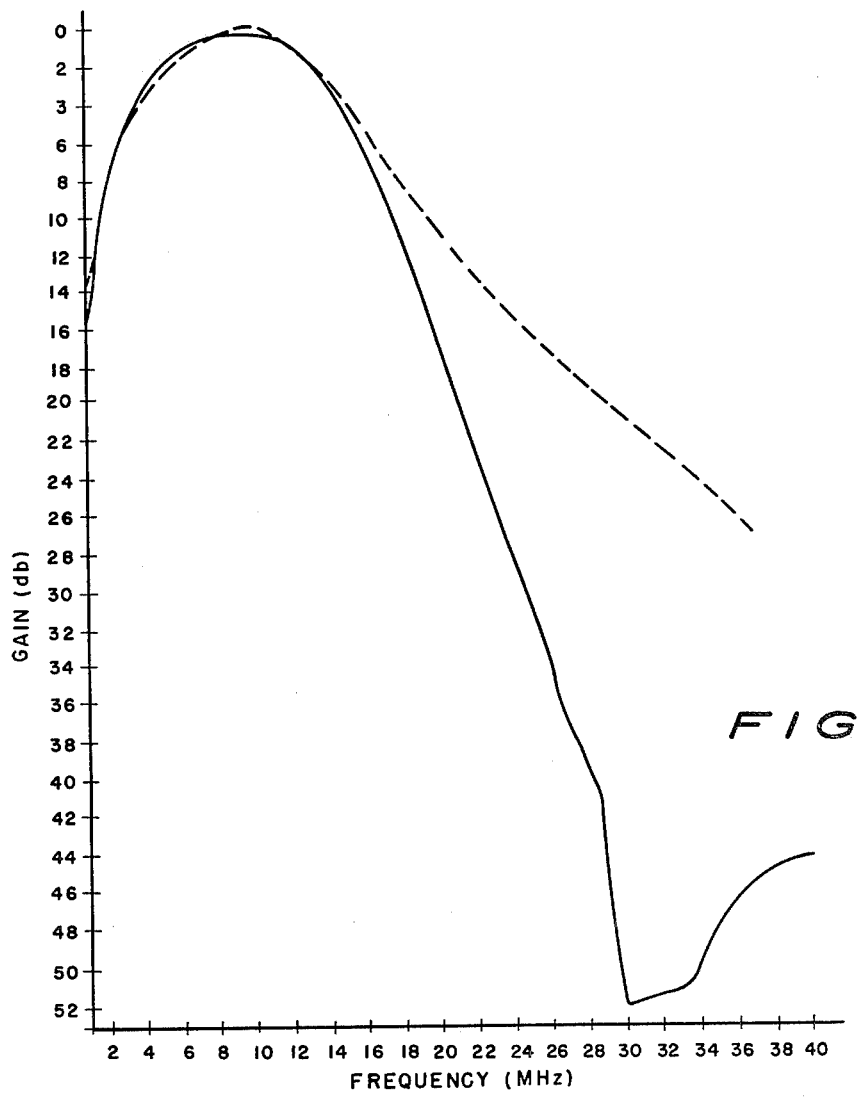
FIG. 2 is a graph comparing the response of the present bandpass filter (shown with solid line) and a prior art filter (shown with dashed line).

The frequency response achieved by combining the four stages and properly selecting the values of the components is much improved over filters of the prior art as shown in FIG. 2. For example, the filter 2 can be designed to pass frequencies at 10 MHz with a bandwidth of at least 10 MHz with some, but not much, response at 20 MHz and nearly no response at 30 MHz (at 30 MHz, the video signal would be contaminated with ringing and the like). Of particular significance in accomplishing these ends is resistance $R_2$ which "smooths" the notching in stage three and serves to lower the Q of the second and third stages.

In essense, the stages act together to create a single desired output response. The first stage as shown in FIG. 2 smooths the input for subsequent filtering; stage two attenuates the 30 MHz portion of the signal as much as possible; stage three tunes to 20 MHz causing the 20 MHz trap not to notch too much, permitting a small response at 20 MHz; and stage four series tunes the filter to 10 MHz and blocks out d.c. signal components.

FIG. 2 shows the response of a prior art filter (in dashed line) and the present invention (in solid line) respectively. The response at 10 MHz remains essentially unaltered with greater attenuation at 20 MHz and 30 MHz with the present circuit.

Various other modifications, adaptations and alterations are of course possible in light of the above teachings. Therefore, it should be understood at this time that within the scope of the appended claims the invention may be practiced otherwise than as specifically described.

What is claimed is:

1. A bandpass filter having a mark-and-space format RF rectangular pulse input and producing a sinusoidal output in response to the rectangular pulse input, comprising, in combination:
    a first state comprising a resistance connected to the ground at one end and to the pulse input at the other,
    a second stage, in parallel with the first stage, comprising an M-derived filter,
    a third stage, connected to the second stage, comprising a notch filter, and
    a fourth stage, connected to the third stage, comprising means for blocking out d.c. signal components and peaking the output response at a desired frequency in the prescribed bandwidth.

2. A bandpass filter, as in claim 1, wherein the third stage comprises:
    a parallel RL network connected at one end to the output of the second stage and coupled to ground through a capacitor at the other end.

3. A bandpass, filter, as in claim 2, wherein the fourth stage comprises a serial LC circuit the input to which is connected to the output of the second stage and the output from said fourth stage being a sinusoidal waveform corresponding to the pulse input.

4. A bandpass filter, as in claim 3, wherein the second stage comprises:
    inductors in series, and
    an LC circuit connected at one end between the inductors in series and connected at the other end to the ground, pulse input to the bandpass filter entering both the resistance in the first stage and the first inductor in the second stage.

* * * * *